United States Patent [19]
Long

[11] Patent Number: 5,487,020
[45] Date of Patent: Jan. 23, 1996

[54] REFINEMENT OF COLOR IMAGES USING REFERENCE COLORS

[75] Inventor: Timothy Long, West Pymble, Australia

[73] Assignees: Canon Information Systems Research Australia PTY Ltd., N. Ryde, Australia; Canon Inc., Tokyo, Japan

[21] Appl. No.: 180,295

[22] Filed: Jan. 12, 1994

[30] Foreign Application Priority Data

Jan. 18, 1993 [AU] Australia ................ PL6840

[51] Int. Cl.⁶ .................... H04N 9/64; G03F 3/00
[52] U.S. Cl. .................. 364/571.01; 348/649; 358/520
[58] Field of Search ............. 345/150; 348/518, 348/577, 649; 358/520; 364/571.01

[56] References Cited

U.S. PATENT DOCUMENTS

| | | | |
|---|---|---|---|
| 4,409,614 | 10/1983 | Eichler et al. | 358/530 |
| 4,954,881 | 9/1990 | Kaye | 348/577 |
| 4,999,703 | 3/1991 | Henderson | 348/747 |
| 5,254,978 | 10/1993 | Beretta | 345/150 |
| 5,255,083 | 10/1993 | Capitant et al. | 358/527 |
| 5,282,021 | 1/1994 | Bachmann et al. | 348/649 |
| 5,351,141 | 9/1994 | Tsuji et al. | 348/645 X |
| 5,363,318 | 11/1994 | McCauley | 364/571.01 |
| 5,377,024 | 12/1994 | Dillinger | 358/520 X |
| 5,377,025 | 12/1994 | Spaulding et al. | 358/520 X |
| 5,384,601 | 1/1995 | Yamashita et al. | 358/520 X |
| 5,398,120 | 3/1995 | Friedman et al. | 358/520 X |

FOREIGN PATENT DOCUMENTS

45868/85  7/1985  Australia.

OTHER PUBLICATIONS

"Compositing Digital Images", by Thomas Porter and Tom Duff, published in Computer Graphics, vol. 18, No. 3, Jul. 1984, p. 253.

Primary Examiner—Edward R. Cosimano
Attorney, Agent, or Firm—Fitzpatrick, Cella, Harper & Scinto

[57] ABSTRACT

Methods of correcting color images often involve a complex interrelation of many color components and require extensive training to be able to be fully utilized. The present disclosure involves a simplified form of color correction. From the selection of a series of actual (16,17) and desired (18,19) colors, a series of contrast and brightness values are derived, which can then be applied to the color image to produce the color corrected image.

3 Claims, 4 Drawing Sheets

REFINEMENT OF COLOR IMAGES USING REFERENCE COLORS

The present invention relates to the correction of color images for the subsequent display or printing of color images. In particular the present invention relates to the correction of colors using reference colors.

BACKGROUND ART

A number of aspects of the background art will now be described with reference to the accompanying drawings:

FIG. 1 illustrates a sample image.

FIG. 2 illustrates a first prior art method of correcting color images.

FIG. 3 illustrates color correction graph of an ideal image not requiring color correction.

FIG. 4 illustrates color correction graphs of a non ideal color image that has had color correction applied, illustrating a change in color brightness.

FIG. 5 illustrates a color correction graph illustrating a decrease in brightness.

FIG. 6 illustrates a color correction graph illustrating a change in contrast.

Color images are often stored on a computer system in a certain format, convenient for the display of images on a color display device. One such format is an RGB additive color format where, for each pixel to be displayed, integer values of the Red, Green and Blue color channel components of that particular pixel are stored, with normally the integer values only taking on a certain range of values. For example, a common format used is to store 8-bits of color information for each of the Red, Green and Blue color channels, with each channel taking on possible values in the range of 0 to 255, thereby providing 256 separate color levels, and over 16 million separate displayable colors when considering all three color channels.

Other popular data storage fomats, to which the present invention can be applied, by means of transformations, known to those skilled in the art, include Cyan, Magenta, Yellow and Black (CYMK), Hue, Saturation, Value (HSV), Hue, Lightness, Saturation (HLS) models.

In another popular format for the storing colors (known as an RGBA format) the RGB information is stored in addition to an opacity value O being stored which relates to the degree of transparency (or Opacity) that particular image has at that particular pixel. This method of storage is especially convenient when multiple images are to be 'composited' over one another and transparency effects are to be used in the final composite color image. A full discussion of the compositing process using an opacity channel is disclosed in 'Compositing Digital Images' by Thomas Porter and Tom Duff, published in Computer Graphics, Volume 18, Number 3, July 1984, at page 253.

It is often desirable to correct particular color information in a picture by alteration of the particular color values that the color channels of an image take, a process known as color correction. This color correction process is often performed with images that have been scanned into a computer storage device using a scanning device designed to produce, for example, RGB formatted color output. The reasons for performing color correction are many and various and include:

the correction of over- or under exposure problems, to neutralize any color cast due to lighting, filters, film, etc. and to optimise the reproduction range by adjusting the overall contrast.

Adjustment of tonal clipping of areas near the extremes of the displayable gamut of colors and the correction of out of gamut errors.

Applying various enhancements to the image, by for example, altering certain colors so that the image has a 'warmer' or 'cooler' appearance.

Color information data stored containing opacity information can be used with the present invention by first recovering the relevant color information and using the method of the present invention on the recovered color information.

Referring now to FIG. 1 and FIG. 2, there is shown a first method of correcting color images. In a software system designed for the color correction of images, a color correction panel 1 is provided containing a number of sliders 2, one for each color channel, from which the user can select and alter the sliders and the effect of the alterations are transferred to the image 4. These effects are often applied immediately to the image 4 thereby providing an immediate feed back effect. Alternatively, a manual input means 3 is provided for inputting selected numerical values to which the sliders 2 are automatically set and the changes reflected in the image 4. The values which the sliders can take lie between a certain maximum and minimum range (generally 0 to 255) and are used to derive a contrast and brightness value for each color channel as described below.

Referring now to FIG. 3 there is shown,color correction graph of an ideal image not requiring Color correction. In this image the pixel values at each location and for each channel stay the same for the input and output, for example, an input value of 100 will become an output value of 100, and so forth. The contrast value is derived to be a measure of the gradient of the color correction graph, whereas the brightness value is defined to be a measure of the output value at an input intensity of zero.

Referring now to FIG. 4 there is shown color correction graphs of a non ideal color image that has had color correction applied, illustrating a change in color brightness. In this example of a color correction graph 5 the brightness has been increased to a base level 6, so that the minimum value of input now has a greater value of output and all other color values are mapped accordingly. As it is assumed that the maximum color value displayable using an 8-bit schema is 255, and that input values that would normally give values greater than this maximum limit 7 are mapped to 255.

Referring now to FIG. 5 there is shown a color correction graph illustrating a decrease in brightness. Again, those values that would fall below a minimum limit 8, must be clippped to zero.

Referring now to FIG. 6 there is shown color correction graph illustrating a change in contrast. In this graph, the contrast, or gradient of the graph, has been increased so that the difference between neighbouring values has also increased, thereby increasing the contrast of a certain portion of the image. Those values less than a minimum (or maximum) limit 8 are clipped to be at that maximum limit.

Hence for each channel of input color, a color correction graph can be described by two variables, being the gradient or contrast c, and the intercept value for zero input being the brightness b. The output color produced relative to the input color, apart from any bounds clipping that may take place, is related by the equation:

$$output = (input * c) + b \quad (EQ\ 1)$$

The values for b and c can be read directly for the slider channel for each color and the relevant color corrections applied for each color channel. Although experienced publishers of color images can effectively use such a color slider device as they have a good idea of how such a device works, a novice user is at a disadvantage in the use of such a device and therefore utility of such a color correction panel is limited.

SUMMARY OF THE INVENTION

It is an object of the present invention to provide a simplified and alternative color correction method.

In accordance with the present invention, there is provided a method for correcting a color image, said color image including a plurality of color information channels, said method comprising the steps of:

selecting a first input reference color and a corresponding first desired output color;

selecting a second input reference color and a corresponding second desired output color; and deriving information values for use in color correcting each color information channel of said color image.

Preferably, the deriving step includes producing a color correction graph from said selected points and producing a line intersecting a first point being the intersection of said first input reference color and said first desired output color and a second point being the intersection of said second input reference color and said second desired output color and deriving a brightness value from the intersection of said line with a zero input color value and deriving a contrast value from the gradient of said line.

BRIEF DESCRIPTION OF THE DRAWINGS

A preferred embodiment of the present invention will now be described with reference to the remaining drawings in which.

DETAILED DESCRIPTION

Figure 7:
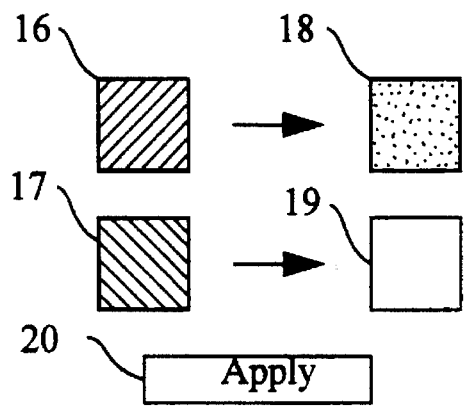
FIG. 7 illustrates a method of choosing two original colors and two final colors and FIG. 8 illustrates the color correction graph of the preferred embodiment.

Referring now to FIG. 7 there is shown a method of choosing two original colors and two final colors. The two original colors comprising a first input color 16 and a second input color 17, are taken from those portions of the image that the user wishes to change. The selection of a color of an image which is being displayed, and the subsequent independent display of that color, is a process known to those skilled in the art of developing computer graphics packages. The two final colors can be taken from the image itself, but are preferably taken from a color wheel display. An example, designed specifically to improve image contrast is where blacks in the image appear 'washed out' and the whites appear murky. In order to improve the picture, the black from the image can form the first input color 16 and a full black from a color wheel or like color selection device, known to those skilled in the art, would form the first output color 18. Similarly, the murky white from the image can form the second input color 17 and a full white from a color wheel would form the second output color 19. Upon pressing the apply button 20 the color correction desired to achieve the desired effect is applied to the image.

Figure 8:
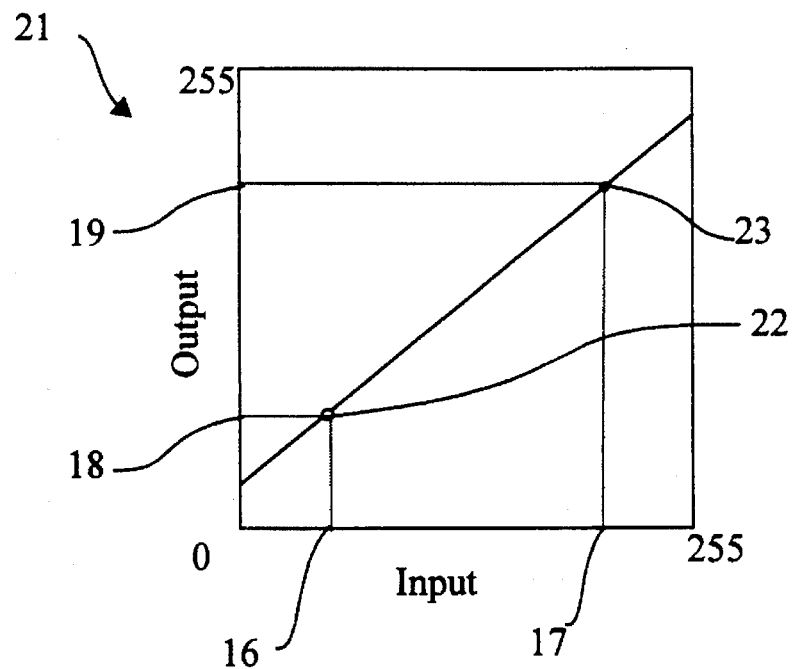
Figure 9:
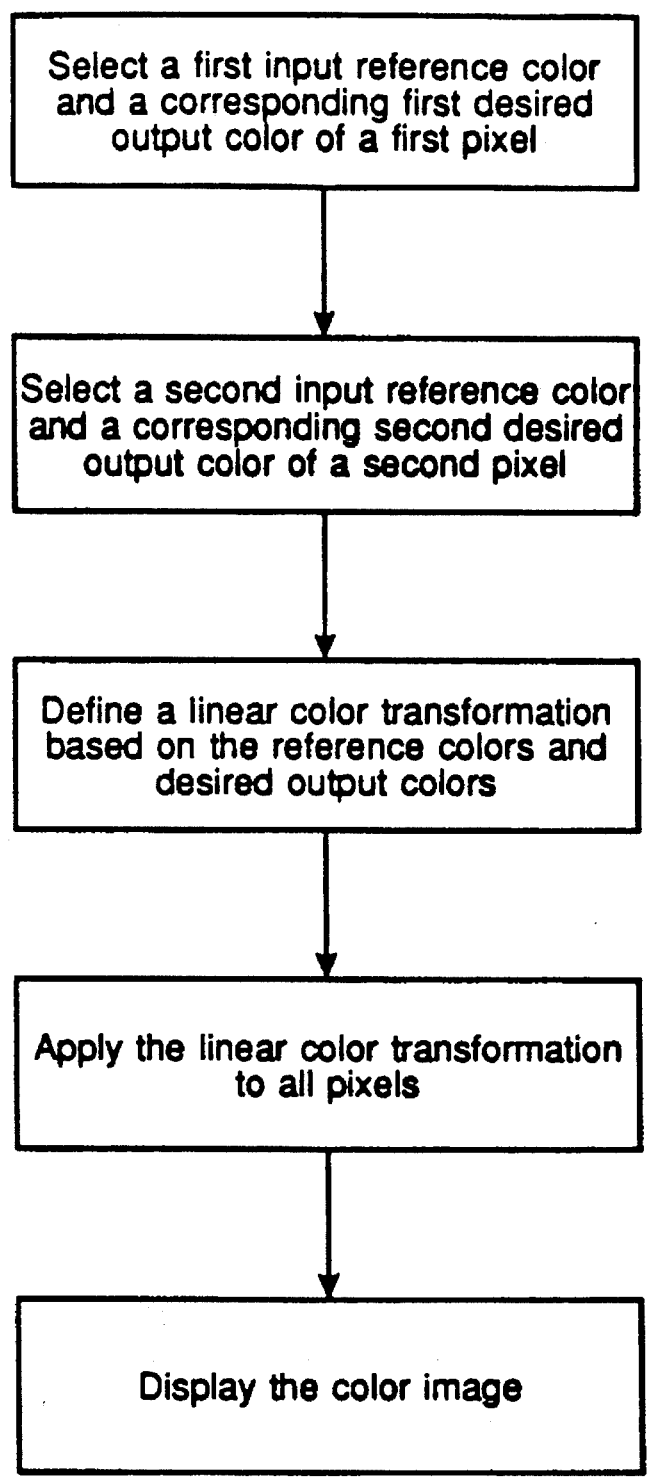
FIG. 9 is a flow chart illustrating a color correction method in accordance with a preferred embodiment of the present invention.

Referring now to FIG. 8 there is shown the color correction graph of the preferred embodiment. This color correction graph is derived in the following manner upon the pressing of the apply button 20. The first input color 16 and first output color 18 form a first point 22 on a color correction graph 21, and the second input color 17 and the second output color 19 form a second point 23 on the color correction graph 21. A line drawn through these two points is used, as shown to form the color correction for the particular graph, with the clipping of color values taking place if necessary. The color correction values of b and c can be derived for this line and used with equation (1) to color correct the image. This process can be repeated for each input color channel to produce a color corrected image, applying the initial desired transformation. This process is shown in the flow chart of FIG. 9.

Additionally, the initial image can be stored with the contrast and brightness settings for each channel.

An apparatus implementing the preferred embodiment can comprise a general purpose computer system having a high resolution monitor capable of displaying a graphical user interface.

The computer system could then be programmed to display the image as depicted in FIG. 7. The user would then be instructed to choose the candidate colors 16–19, using an interactive device such as a mouse or the like. Upon choosing the apply button 20, the contrast and brightness values are derived for each primary as hereinbefore described and subsequently applied to every pixel in the input image to thereby produce a color corrected input image.

The foregoing describes only one embodiment of the present invention particular to the RGB model of image storage. The use of other models such as the CYMK model used in color printing or the RGBA model used in compositing, and modifications, obvious to those skilled in the art, can be made thereto without parting from the scope of the invention.

We claim:

1. A method for color correcting a predetermined portion of a color image, said color image comprising a plurality of pixels and a plurality of color information channels for each of said plurality of pixels, said method comprising the steps of:

selecting in said predetermined portion a first input reference color of a first pixel and a corresponding first desired output color of the first pixel;

selecting in said predetermined portion a second input reference color of a second pixel and a corresponding second desired output color of the second pixel;

defining a linear color transformation for each color information channel based on the input reference colors and the desired output colors;

applying said linear color transformation to all pixels in said predetermined portion; and displaying the color image.

2. A method of correcting a color image as claimed in claim 1 wherein said linear color transformation includes contrast and brightness values for each said color information channel of said color image.

3. A method of correcting a color image as claimed in claim 1 wherein said plurality of color information channels include red, green and blue color channels.

\* \* \* \* \*

UNITED STATES PATENT AND TRADEMARK OFFICE
CERTIFICATE OF CORRECTION

PATENT NO. : 5,487,020

DATED : January 23, 1996

INVENTOR(S): TIMOTHY LONG

It is certified that error appears in the above-identified patent and that said Letters Patent is hereby corrected as shown below:

COLUMN 1

Line 13, "drawings:" should read --drawings.--.
    Lines 14-26 should be deleted.
    Line 48, "Opacity)" should read --opacity)--.
    Line 67, "under exposure" should read
        --under-exposure--.

COLUMN 2

Line 31, "shown,color" should read --shown color--.
    Line 32, "Color" should read --color--.

UNITED STATES PATENT AND TRADEMARK OFFICE
CERTIFICATE OF CORRECTION

PATENT NO. : 5,487,020

DATED : January 23, 1996

INVENTOR(S): TIMOTHY LONG

It is certified that error appears in the above-identified patent and that said Letters Patent is hereby corrected as shown below:

COLUMN 3

Figure 1:
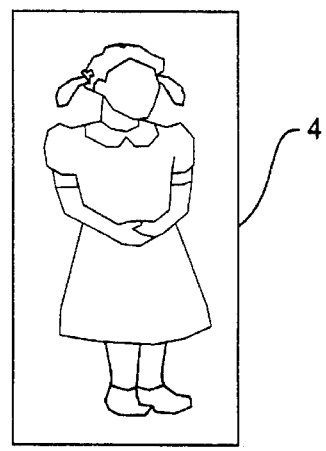
Figure 2:
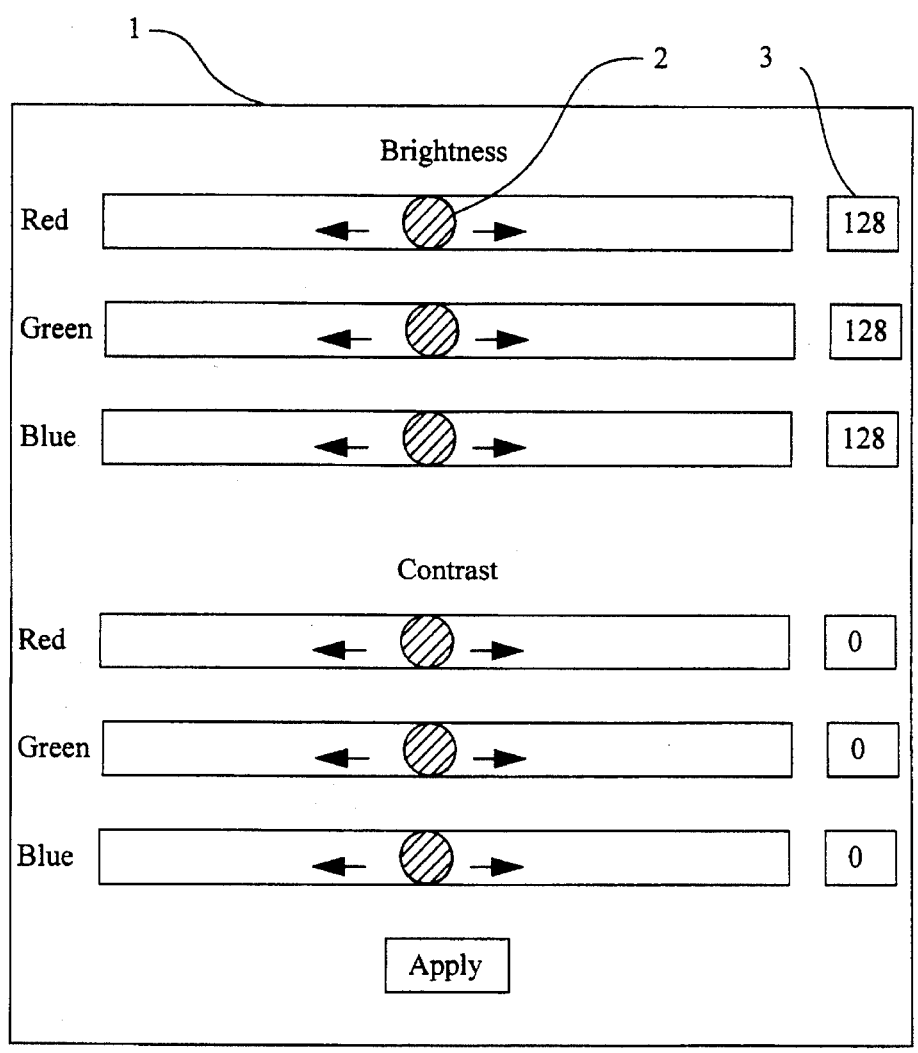
Figure 3:
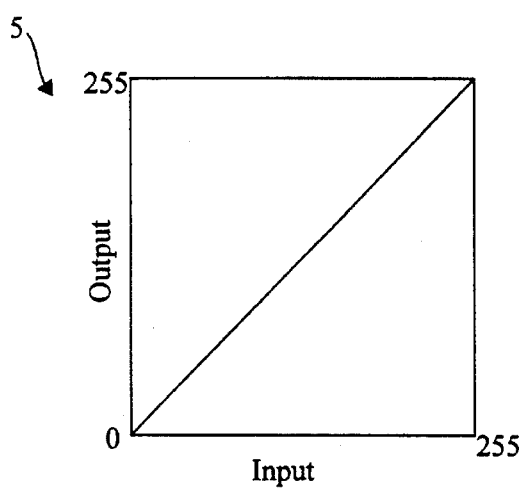
Figure 4:
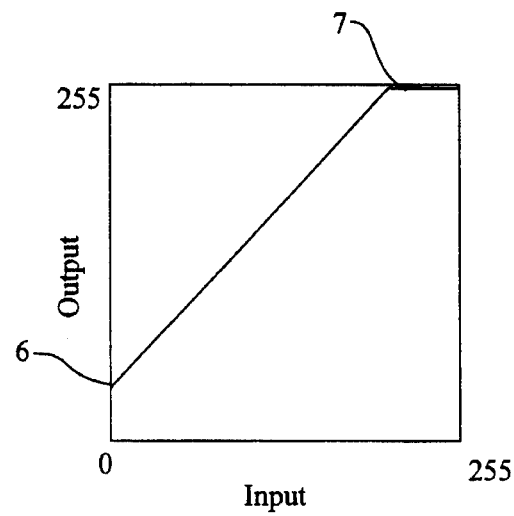
Figure 5:
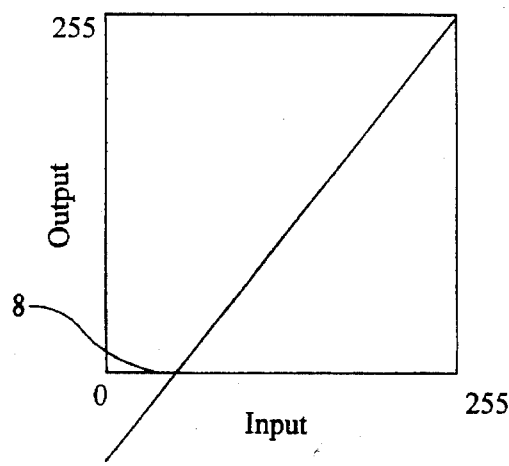
Figure 6:
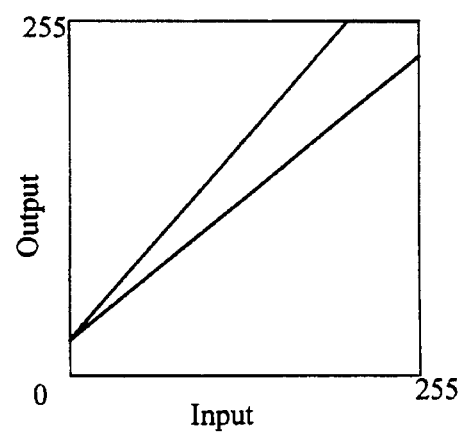

```
Line 31, "reference:" should read --reference--.
Line 39, "remaining" should be deleted.
Line 40, "which:" should read --which:
         ¶ Figure 1 illustrates a sample image.
           Figure 2 illustrates a first prior art
         method of correcting color images.
           Figure 3 illustrates color correction graph
         of an ideal image not requiring color
         correction.
           Figure 4 illustrates color correction graphs
         of a non ideal color image that has had color
         correction applied, illustrating a change in
         color brightness.
           Figure 5 illustrates a color correction
         graph illustrating a decrease in brightness.
           Figure 6 illustrates a color correction
         graph illustrating a change in contrast.--.
```

UNITED STATES PATENT AND TRADEMARK OFFICE
CERTIFICATE OF CORRECTION

PATENT NO. : 5,487,020

DATED : January 23, 1996

INVENTOR(S) : TIMOTHY LONG

It is certified that error appears in the above-identified patent and that said Letters Patent is hereby corrected as shown below:

<u>COLUMN 4</u>

```
Line 18, "the:" should read --the--.
Line 60, "claim 1" should read --claim 1,--.
Line 64, "claim 1" should read --claim 1,--.
```

Signed and Sealed this

Second Day of July, 1996

Attest:

BRUCE LEHMAN

Attesting Officer

Commissioner of Patents and Trademarks